United States Patent
Hsu et al.

(10) Patent No.: US 8,202,592 B2
(45) Date of Patent: Jun. 19, 2012

(54) HOUSING AND METHOD OF MANUFACTURING THEREOF

(75) Inventors: Jen-Hong Hsu, Taipei Hsien (TW); He-Xing Fu, Shenzhen (CN); Hai-Peng Yan, Shenzhen (CN); Yong Yang, Shenzhen (CN); Liang-Bao Tao, Shenzhen (CN); Chang-Shuang Zhu, Shenzhen (CN); Yu-Guo Zhang, Shenzhen (CN); Hai-Lin Chen, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 510 days.

(21) Appl. No.: 12/503,799

(22) Filed: Jul. 15, 2009

(65) Prior Publication Data
US 2010/0266793 A1   Oct. 21, 2010

(30) Foreign Application Priority Data
Apr. 16, 2009 (CN) .......................... 2009 1 0301608

(51) Int. Cl.
*B29D 22/00* (2006.01)
*B29D 23/00* (2006.01)
*B32B 1/08* (2006.01)

(52) U.S. Cl. ..................... 428/35.7; 428/35.8; 428/35.9; 220/62.14; 427/532; 427/258; 427/270; 427/277; 427/355; 427/356; 427/358; 427/371; 427/404; 427/407.1

(58) Field of Classification Search ................. 428/35.8, 428/35.9, 35.7; 220/62.14; 427/358, 532, 427/258, 270, 277, 355, 356, 371, 404, 407.1
See application file for complete search history.

(56) References Cited

U.S. PATENT DOCUMENTS
7,666,497 B2 * 2/2010 Takatsuki et al. .............. 428/337
* cited by examiner

*Primary Examiner* — Michael C Miggins
(74) *Attorney, Agent, or Firm* — Altis Law Group, Inc.

(57) ABSTRACT

A housing includes a plastic substrate, a supporting layer, a hair line layer, a decorative layer, and a transparent protection layer. The supporting layer, the hair line layer, the decorative layer, and the transparent protection layer are formed on the substrate in that order.

20 Claims, 2 Drawing Sheets

HOUSING AND METHOD OF MANUFACTURING THEREOF

BACKGROUND

1. Technical Field

The disclosure relates to a housing and, particularly, to a housing for an electronic device.

2. Description of the Related Art

Electronic devices such as notebook computers, MP3 players, personal digital assistants, and mobile phones, are in common use. A pleasing appearance and finish, such as a metallic finish, are often important to users.

Accordingly, textured patterns or stripes are often formed on the exterior housing of such devices. Hair lines are commonly formed on metallic housings of materials such as magnesium alloy, aluminum, and stainless steel. However, such metallic housings are difficult to manufacture and at a high cost. Plastic housings are easily manufactured by injection molding and have a low cost, but lack the appeal of the metallic finish and texturing which can be difficult to directly form on the plastic housing.

Therefore, what is needed, is a housing that overcomes the limitations described.

BRIEF DESCRIPTION OF THE DRAWING

The components in the drawing are not necessarily drawn to scale, the emphasis instead being placed upon clearly illustrating the principles of the present disclosure.

DETAILED DESCRIPTION

Figure 1:
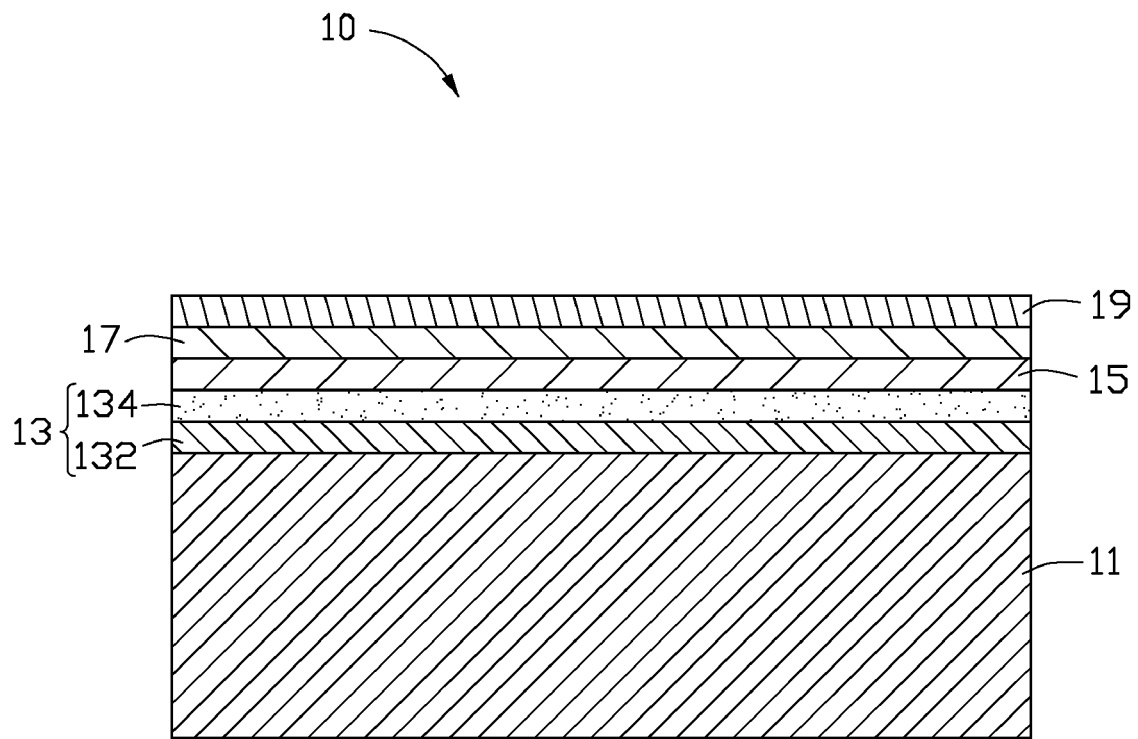
FIG. 1 is a cross-section of a portion of an embodiment of a housing.

Referring to FIG. 1, an embodiment of a housing 10 includes a substrate 11, a supporting layer 13, a hair line layer 15, a decorative layer 17, and a transparent protection layer 19. The supporting layer 13, the hair line layer 15, the decorative layer 17, and a transparent protection layer 19 are formed on the substrate 11 in that order.

The housing 10 may be a front cover, a back cover, a foldable cover or a slidable cover employed in many types of electronic devices.

The substrate 11 may be acrylonitrile butadiene styrene (ABS), polycarbonate (PC), polyphenylene sulfide (PPS), or any suitable combination thereof.

The supporting layer 13 can improve a hardness and a flatness of the substrate 11. The supporting layer 13 includes a prime layer 132 adjacent to the substrate 11, and an enhancing coating layer 134 formed on the prime layer 132.

The prime layer 132 enhances a bonding strength between the substrate 11 and the enhancing coating layer 134. The prime layer 132 may consist essentially of acrylic resin, polyester resin, epoxy resin, amidocyanogen resin, black pigments, ethylene-acrylate copolymer, propylene glycol monomethyl ether acetate (PMA), and butyl ester. The black pigments may be carbon black. A thickness of the prime layer 132 may be from about 25 micrometers (μm) to about 50 μm. Defects formed on the substrate 11 such as pits and thin grooves during injection molding are masked by the prime layer 132, thus the flatness of the substrate 11 is improved.

The enhancing coating layer 134 has a relatively high hardness and may consist essentially of acrylic resin, polyester resin, epoxy resin, amidocyanogen resin, pigments, ethylene-acrylate copolymer, PMA, and butyl ester. The enhancing coating layer 134 may further improve hardness and flatness of the substrate 11. A thickness of the enhancing coating layer 134 may be from about 15 μm to about 80 μm.

The hair line layer 15 is formed on the enhancing coating layer 134.

The decorative layer 17 may be a metallic coating layer in colors such as silver, gold, or other decorative finishes, achieving a metallic hair line layer 15. The decorative layer 17 may consist essentially of acrylic resin, polyester resin, epoxy resin, amidocyanogen resin, ethylene-acrylate copolymer, PMA, butyl ester, and nano-aluminum oxide powder or nano-aluminum oxide flakes. In the illustrated embodiment, the decorative layer 17 consists essentially of acrylic resin and nano $Al_2O_3$ powder. A thickness of the decorative layer 17 may be from about 2 μm to about 7 μm.

The transparent protection layer 19 may consist essentially of acrylic resin and silicon oxide, and has a high bonding strength with the decorative layer 17. A thickness of the transparent protection layer 19 may be from about 20 μm to about 80 μm.

The substrate 11, as a main portion of the housing 10, is made of plastic material, thus the housing 10 is much cheaper than a metallic housing. The hair line layer 15 presents a pleasing metallic finish because the decorative layer 17 is a metallic enhancing coating layer.

It should be noted that if the substrate 11 has a good uniformity and hardness, the enhancing coating layer 134 may be omitted. In such a case, the hair line layer 15 is directly formed on the prime layer 132.

It should also be noted that if the substrate 11 has a good uniformity and a bonding strength between the substrate 11, and the enhancing coating layer 134 is sufficient, the prime layer 132 may be omitted.

Figure 2:
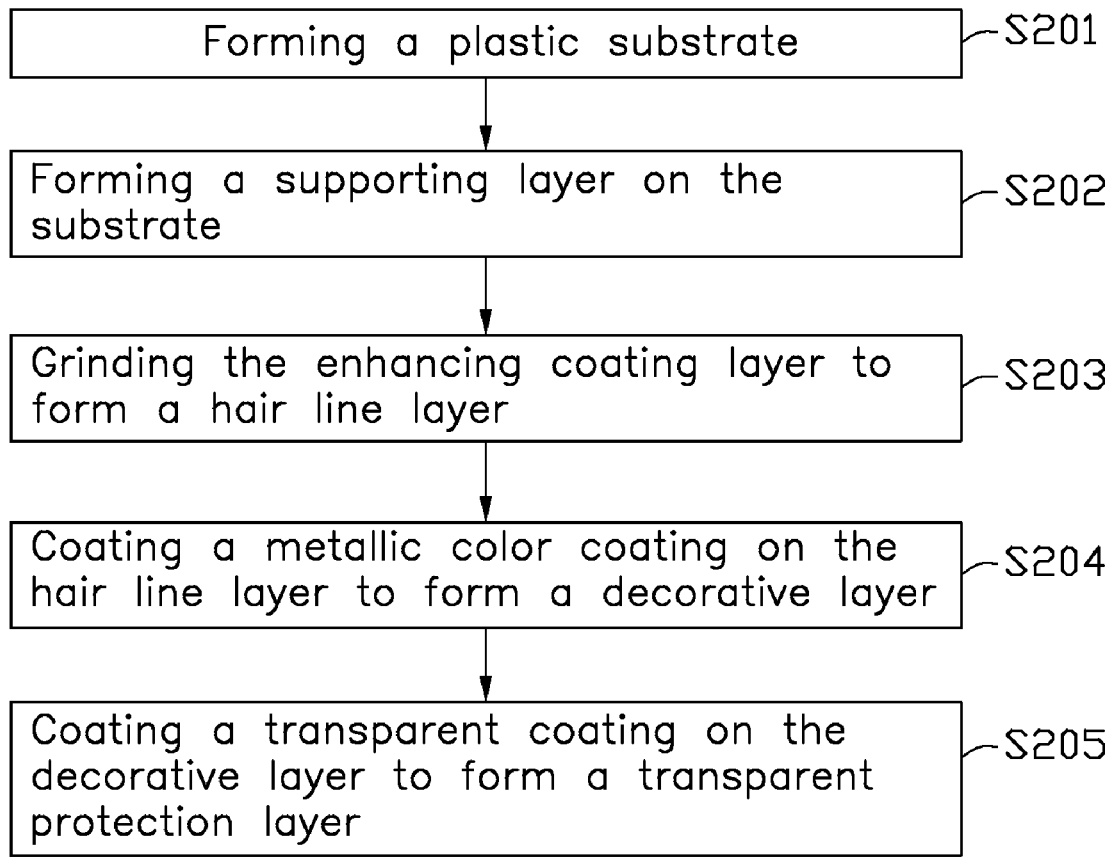
FIG. 2 is a flowchart of a method of manufacturing the housing of FIG. 1.

Referring to FIG. 2, a method of manufacturing the housing 10 is also provided. Depending on the embodiment, certain of the steps described below may be removed, others may be added, and the sequence of steps may be altered.

Beginning in step S201, a plastic substrate 11 is formed by injection molding.

In step S202, the supporting layer 13 is formed on the substrate 11, as follows. Primer is brushed on the substrate 11 and dried, such that the primer layer 132 is formed. Prime coating of the substrate 11 can be accomplished by spray coating. The primer may consist essentially of acrylic resin, polyester resin, epoxy resin, amidocyanogen resin, black pigments, ethylene-acrylate copolymer, PMA, and butyl ester. The black pigments may be carbon black. The primer is dried at from about 50 degrees Celsius (° C.) to about 100° C., for about 10 minutes to 30 about minutes. An enhancing lacquer is coated on the primer layer 132, and may consist essentially of acrylic resin, polyester resin, epoxy resin, amidocyanogen resin, pigments, ethylene-acrylate copolymer, PMA, and butyl ester. When the enhancing lacquer is dried, the enhancing coating layer 134 is formed on the primer layer 132. The enhancing laquer is dried at from about 50° C. to about 100° C., for about 10 minutes to about 30 minutes.

In step S203, the enhancing coating layer 134 is ground with a grinding wheel, so that a portion of the enhancing coating layer 134 forms the hair line layer 15. The grinding wheel may be made of cloth.

In step S204, a metallic color coating is coated on the hair line layer 15 and dried, thereby forming the decorative layer 17. The metallic color coating may consist essentially of acrylic resin, polyester resin, epoxy resin, amidocyanogen resin, ethylene-acrylate copolymer, PMA, butyl ester, and nano-aluminum oxide powder or nano-aluminum oxide flakes. A thickness of the decorative layer 17 may be about 2 μm to about 7 μm. A method of coating the metallic color coating on the hair line layer 15 may be accomplished by spray coating. The dried temperature is from about 50° C. to about 100° C., the dried time is from about 10 minutes to about 30 minutes.

In step S205, a transparent coating is coated on the decorative layer 17 and dried, thereby forming a transparent protection layer 19. The transparent coating may consist essentially of acrylic resin and silicon oxide. The transparent coating can be spray coated on the decorative layer 17. The drying temperature is from about 50° C. to about 100° C., for about 10 minutes to about 30 minutes.

It may be noted that if the substrate 11 has a good uniformity and hardness, formation of the enhancing coating layer 134 in step S202 may be omitted.

It should also be noted that if the substrate 11 has a good uniformity and a bonding strength between the substrate 11 and the enhancing coating layer 134 is sufficient, formation of the prime layer 132 in step S202 may be omitted.

In one embodiment of a method of manufacturing a housing, a substrate is injection molded with a plastic material including ABS. A primer, coated on the substrate, consists essentially of acrylic resin, polyester resin, epoxy resin, amidocyanogen resin, black pigments, ethylene-acrylate copolymer, PMA, and butyl ester. The primer coated on the substrate is dried for about 10 minutes to about 30 minutes at from about 50° C. to about 100° C., thereby forming a prime layer having a thickness of about 25 μm to about 50 μm. The prime layer may be ground with a grinding wheel, such that a portion of the prime layer forms a hair line layer. A metallic color coating, coated on the hair line layer, consists essentially of acrylic resin, polyester resin, epoxy resin, amidocyanogen resin, ethylene-acrylate copolymer, PMA, butyl ester, and nano-aluminum oxide powder or nano-aluminum oxide flakes. The metallic color coating is dried for about 10 minutes to about 30 minutes at about 50° C. to about 100° C., thereby forming a decorative layer having a thickness of about 2 μm to about 7 μm. A transparent coating consisting essentially of acrylic resin and silicon oxide is coated on the decorative layer. The transparent coating is dried for about 10 minutes to about 30 minutes at about 50° C. to about 100° C., thereby forming a transparent protection layer having a thickness of about 20 μm to about 80 μm. The housing is thus complete.

In another embodiment of a method of manufacturing a housing, a substrate is injection molded of plastic material including PC. An enhancing lacquer, coated on the substrate, consists essentially of acrylic resin, polyester resin, epoxy resin, amidocyanogen resin, pigments, ethylene-acrylate copolymer, PMA, and butyl ester. The enhancing lacquer coated on the substrate is dried for about 10 minutes to about 30 minutes at about 50° C. to about 100° C., thereby forming an enhancing coating layer having a thickness of about 25 μm to about 50 μm. The enhancing coating layer may be ground with a grinding wheel, such that a portion of the enhancing coating layer forms a hair line layer. A metallic color coating, coated on the hair line layer, consists essentially of acrylic resin, polyester resin, epoxy resin, amidocyanogen resin, ethylene-acrylate copolymer, PMA, butyl ester, and nano-aluminum oxide powder or nano-aluminum oxide flakes. The metallic color coating is dried for about 10 minutes to about 30 minutes at about 50° C. to about 100° C., thereby forming a decorative layer having a thickness of about 2 μm to about 7 μm. A transparent coating consisting essentially of acrylic resin and silicon oxide is coated on the decorative layer. The transparent coating is dried for about 10 minutes to about 30 minutes at about 50° C. to about 100° C., thereby forming a transparent protection layer having a thickness of about 20 μm to about 80 μm. The housing is thus complete.

In yet another embodiment of a method of manufacturing a housing, a substrate is injection molded of a plastic material including ABS and PC. A primer, coated on the substrate, consists essentially of acrylic resin, polyester resin, epoxy resin, amidocyanogen resin, black pigments, ethylene-acrylate copolymer, propylene glycol monomethyl ether acetate (PMA), and butyl ester is. The primer coated on the substrate is dried for about 10 minutes to about 30 minutes at about 50° C. to about 100° C., thereby forming a prime layer having a thickness of about 25 μm to about 50 μm. An enhancing lacquer, coated on the prime layer, consists essentially of acrylic resin, polyester resin, epoxy resin, amidocyanogen resin, pigments, ethylene-acrylate copolymer, PMA, and butyl ester. The enhancing lacquer coated on the prime layer is dried for about 10 minutes to about 30 minutes at about 50° C. to about 100° C., thereby forming an enhancing coating layer having a thickness of minutes 25 μm to minutes 50 μm. The enhancing coating layer may be ground with a grinding wheel, such that a portion of the enhancing coating layer forms a hair line layer. A metallic color coating, coated on a hair line layer, consists essentially of acrylic resin, polyester resin, epoxy resin, amidocyanogen resin, ethylene-acrylate copolymer, PMA, butyl ester, and nano-aluminum oxide powder or nano-aluminum oxide flakes. The metallic color coating is dried for about 10 minutes to about 30 minutes at about 50° C. to about 100° C., thereby forming a decorative layer having a thickness of about 2 μm to about 7 μm. A transparent coating consisting essentially of acrylic resin and silicon oxide is coated on the decorative layer. The transparent coating is dried for about 10 minutes to about 30 minutes at about 50° C. to about 100° C., thereby forming a transparent protection layer having a thickness of about 20 μm to about 80 μm. The housing is thus complete.

A bonding strength of samples of the housing was evaluated after the transparent protection layer was formed. Bonding strengths of the samples of the housing were from about 4 B to about 3 B.

A pencil hardness of the samples of the housing was evaluated with a pencil after the transparent protection layer was formed. A pencil was applied on the surface of the housing at an angle of 45° with a force of 9.8 Newtons. The pencil hardness of the samples of the housing was from about 1 H to about 2 H.

A solvent resistance of the samples the housing was evaluated with a solvent resistance test after the transparent protection layer was formed. The housing was wiped 50 times according to the standard of ASTM (The American Society for Testing and Materials) D4752, and a resistance grade of the housing is 4.

An abrasion resistance of the samples the housing was evaluated with a Norman Abrasion test after the transparent protection layer was formed. When a force of 175 g gravity was used to polish the housing, no fish eyes or ripples appeared on the surface of the housing.

The test result shows that the housing has relatively high bonding strength, high solvent resistance, high hardness, and high abrasion resistance.

Finally, while various embodiments have been described and illustrated, the embodiments are not to be construed as being limited thereto. Various modifications can be made to the embodiments by those skilled in the art without departing from the true spirit and scope of the invention as defined by the appended claims.

What is claimed is:

1. A housing, comprising:
   a plastic substrate; and
   a supporting layer, a hair line layer, a decorative layer, and a transparent protection layer formed on the substrate in that order.

2. The housing of claim 1, wherein the substrate is acrylonitrile butadiene styrene, polycarbonate, or polyphenylene sulfide, or any suitable combination thereof.

3. The housing of claim 1, wherein the transparent protection layer consists essentially of acrylic resin; and a thickness of the transparent protection layer is from about 20 µm to about 80 µm.

4. The housing of claim 1, wherein the supporting layer comprises a prime layer adjacent to the substrate.

5. The housing of claim 4, wherein the prime layer consists essentially of acrylic resin, polyester resin, epoxy resin, amidocyanogen resin, black pigments, ethylene-acrylate copolymer, propylene glycol monomethyl ether acetate (PMA), and butyl ester.

6. The housing of claim 4, wherein the supporting layer further comprises an enhancing coating layer coated on the prime layer; and the hair line layer is formed on the enhancing coating layer.

7. The housing of claim 6, wherein a thickness of the prime layer is from about 25 µm to about 50 µm, and a thickness of the enhancing coating layer is from about 15 µm to about 80 µm.

8. The housing of claim 6, wherein the enhancing coating layer consists essentially of acrylic resin, polyester resin, epoxy resin, amidocyanogen resin, pigments, ethylene-acrylate copolymer, PMA, and butyl ester.

9. The housing of claim 1, wherein the supporting layer comprises an enhancing coating layer adjacent to the substrate.

10. The housing of claim 9, wherein the enhancing coating layer consists essentially of acrylic resin, polyester resin, epoxy resin, amidocyanogen resin, pigments, ethylene-acrylate copolymer, PMA, and butyl ester.

11. The housing of claim 1, wherein the decorative layer consists essentially of acrylic resin, polyester resin, epoxy resin, amidocyanogen resin, ethylene-acrylate copolymer, PMA, butyl ester, and nano-aluminum oxide powder or nano-aluminum oxide flakes.

12. The housing of claim 11, wherein a thickness of the decorative layer is from about 2 µm to about 7 µm.

13. A method of manufacturing a housing, the method comprising:
   forming a plastic substrate by injection molding;
   coating a prime coating on the substrate and drying the prime coating, thereby forming a prime layer;
   coating an enhancing lacquer on the prime layer and drying the enhancing lacquer, thereby forming an enhancing coating layer;
   grinding the enhancing coating layer with a grinding wheel, thereby forming a hair line layer;
   coating a metallic color coating on the hair line layer and drying the metallic color coating, thereby forming a decorative layer; and
   coating a transparent coating on the decorative layer and drying the transparent coat, thereby forming a transparent protection layer.

14. The method of claim 13, wherein the prime coating is dried for about 10 minutes to about 30 minutes at about 50° C. to about 100° C.

15. The method of claim 13, wherein the enhancing lacquer is dried for about 10 minutes to about 30 minutes at about 50° C. to about 100° C.

16. The method of claim 13, wherein the transparent coating is dried for about 10 minutes to about 30 minutes at about 50° C. to about 100° C.

17. The method of claim 13, wherein a thickness of the prime layer is about 25 µm to about 50 µm; and the prime layer consists essentially of acrylic resin, polyester resin, epoxy resin, amidocyanogen resin, black pigments, ethylene-acrylate copolymer, PMA, and butyl ester.

18. The method of claim 13, wherein a thickness of the enhancing coating layer is about 15 µm to about 80 µm; and the enhancing coating layer consists essentially of acrylic resin, polyester resin, epoxy resin, amidocyanogen resin, pigments, ethylene-acrylate copolymer, PMA, and butyl ester.

19. The method of claim 13, wherein a thickness of the decorative layer is about 2 µm to about 7 µm; and the decorative layer consists essentially of acrylic resin, polyester resin, epoxy resin, amidocyanogen resin, ethylene-acrylate copolymer, PMA, butyl ester, and nano-aluminum oxide powder or nano-aluminum oxide flakes.

20. The method of claim 13, wherein the transparent protection layer consists essentially of acrylic resin; and a thickness of the transparent protection layer is about 20 µm to about 80 µm.

* * * * *